United States Patent [19]

Slater et al.

[11] Patent Number: 5,535,095
[45] Date of Patent: Jul. 9, 1996

[54] ADJUSTABLE CHASSIS FOR ELECTRONIC APPARATUS FOR INSTALLATION IN VARIABLE THICKNESS PANELS

[76] Inventors: R. Winston Slater, 48W938 Chandelle Dr., Hampshire, Ill. 60140; Carl C. Sorensen, 905 S. Main St., Racine, Wis. 53403

[21] Appl. No.: 228,152

[22] Filed: Apr. 15, 1994

[51] Int. Cl.$^6$ .................................. H05K 1/18; H05K 7/14
[52] U.S. Cl. .......................... 361/725; 174/57; 220/3.7; 361/753; 200/296
[58] Field of Search ................... 174/35 R, 50, 174/52.1, 57; 220/3.7, 8; 248/27.1; 200/296; 361/600, 601, 796, 627, 641, 643, 679, 722, 724, 725, 727, 729, 730, 736, 752, 753, 816

[56] References Cited

U.S. PATENT DOCUMENTS

| | | | |
|---|---|---|---|
| 3,871,606 | 3/1975 | Larson | 248/27.1 |
| 3,956,675 | 5/1976 | Bauer | 174/52.1 |
| 3,961,229 | 6/1976 | Splitt | 317/120 |
| 4,227,237 | 10/1980 | Matthews | 361/415 |

FOREIGN PATENT DOCUMENTS

| | | | |
|---|---|---|---|
| 0270399 | 10/1989 | Japan | 174/35 R |
| 380791 | 9/1932 | United Kingdom | 174/57 |

*Primary Examiner*—Gerald P. Tolin
*Attorney, Agent, or Firm*—Maksymonko & Slater

[57] ABSTRACT

An adjustable housing or chassis for electronic devices specifically intended for mounting in panels of unknown and variable thickness, for example, in the panels of aircraft. The chassis includes base and cover members that telescopingly mate to form a complete enclosure for electronic printed circuits therein. The chassis members include plural flanges and/or sidewalls to create a self-interlocking chassis in which the cover is restrained from lateral and vertical movement on the base. The cover is axially adjustable on the base to thereby expose more or less of the electronic controls as dictated by the thickness of aircraft panel.

1 Claim, 3 Drawing Sheets

ADJUSTABLE CHASSIS FOR ELECTRONIC APPARATUS FOR INSTALLATION IN VARIABLE THICKNESS PANELS

BACKGROUND OF THE INVENTION

The present invention relates to a chassis employed to house electronic circuitry and, in particular, to an adjustable chassis suitable for installation in the instrument panel of a light aircraft.

Such chassis are generally defined by one or more sheet metal or drawn metal components snap-fitted or bolted together to fully enclose the electronic circuitry. Often this circuitry is contained on a rectangular 'printed circuit' board of fixed dimension and, practically without exception, includes a connector at the rear thereof (i.e. for power and other signal inputs and outputs) and one or more switches, controls, or display led's or other indicators at the front thereof.

The light aircraft instrument panel presents some unusual challenges in connection with ordinary chassis designs, namely, the variability in panel thickness and trim found from one aircraft model to another. Aircraft instrument panels typically include a structural steel panel over which, sometimes, a decorative plastic trim panel is placed. Thus, the problem of variable thickness instrument panels includes, first, the uncertainty and variety of 'gages' of steel employed in the underlying structural panel as well as, second, the existence (or not) of a decorative panel thereon.

As a general rule, most light aircraft include a plurality of punched, often circular, openings into which instruments of standard diameter or cross-section may be mounted. But not all equipment is amenable to these standard openings. Many electronic items intended for installation in an aircraft instrument panel rely on the drilling of plural, spaced holes through the panel—generally utilizing a drilling template—thereafter, the insertion of the electronic item into the panel from the rear. The electronic equipment being thereafter affixed to the panel by appropriate bolts, nuts, or other hardware that literally clamp the front portion of the electronic chassis to the panel.

When utilizing this common 'rear mount' approach, it will be understood that the various switches and controls (to be accessible to the pilot) must extend forwardly from the printed circuit board through the aircraft panel(s)—whatever their combined thickness. Herein lies the problem to which the present invention addresses. To the extent that these controls are long enough to penetrate a combined 'thick' instrument panel, the controls will be too long and extend too far through the panel in the event a single panel of comparatively thinner dimension is employed. This will result in the controls and associated knobs being positioned well in front of the panel which, at the very least, results in an aesthetically unsatisfactory finished product. And, at the other extreme, if the controls are rendered short enough to be attractive when installed through a so-called thinner panel, there will be insufficient control shaft length for the retention of knobs or for the engagement of mounting hardware when mounted to a 'thicker' panel.

SUMMARY OF THE INVENTION

The present invention, therefore, pertains to a two-piece chassis construction, defined as a lower or base chassis member and a complementary and mating upper or cover chassis member, which two pieces telescopingly engage one-another and 'self-interlock' thereby to provide an adjustable length chassis that, in cooperation with the internal printed circuit board, results in a correspondingly adjustable protrusion of the control/switch forwardly from the chassis front wall. In this manner, the chassis is adjusted to provide a sufficient, but not excessive, forward extension of the controls as required for mounting of the apparatus to the aircraft panel and, importantly, for proper aesthetics, i.e. orientation of the controls, switches and knobs forwardly and adjacent to the aircraft panel.

More specifically, the base member includes the bottom and rear chassis walls as well as a first, and inner, set of sidewalls. The cover member defines the top and front chassis walls and a second, and outer, set of sidewalls. The rear wall has three forwardly extending flanges that telescopingly receive the respective top and sides of the cover while the front wall has a rearwardly extending flange that similarly telescopingly receives the bottom of the base member. These various flanges are dimensioned to assure proper base and cover engagement throughout the full range of telescoping chassis adjustability. These flanges cooperate with the inner sidewalls, which are specially dimensioned, to positively orient the base and cover members permitting only relative telescoping movement therebetween along the fore/aft longitudinal axis of the chassis.

The printed circuit board is rigidly mounted to the base member using any convenient means including threaded bosses or stand-offs to which retention screws may be anchored. Such stand-offs, however, are not always required particularly for small electronic circuits. Indeed, the previously mentioned connector may serve to rigidly interconnect the rear of the printed circuit board to the rear wall of the base member while the controls—extending forwardly through holes in the front wall of the cover member—orient and lock the front of the circuit board in position.

More specifically, the previously mentioned connector is preferably affixed to the board which is, in turn, secured to the rear chassis wall in an aperture provided therein. In this manner the connector secures the rear of the printed circuit board against movement in any direction while the front of the circuit board is further restrained against movement in the two remaining transverse axes (i.e. vertical and lateral) by restraint of the controls as they protrude through closely dimensioned holes/apertures in the cover front wall.

By reason of the above-described construction, the base and cover members, although interlocking, are axially adjustable with respect to one-another. As the circuit board is rigidly affixed to the base member, adjustment results in the corresponding relative movement of the cover with respect to the forwardly extending switches and controls on the circuit board which, in turn, correspondingly adjusts the extension of such controls forwardly of the cover front wall. The base and cover members are therefore adjusted to expose sufficient control bushings/shafts to permit penetration through, and retention by, the aircraft panel and to allow for the positioning of knobs thereon. As noted, excessive control penetration should be avoided for aesthetic reasons.

It will be further understood that the above-described interlocking chassis not only defines a complete 'wraparound' design fully enclosing all six sides of the electronics therein, but the various overlapping sidewalls and flanges minimize the formation of slots or other openings that breach the shielding integrity of the assembled chassis. In this manner the present chassis construction minimizes the likelihood of electromagnetic radiation penetrating and interfering with the electronics within the chassis enclosure and, similarly, protects against the harmful radiation of such energy from the electronics therein.

Affixing the cover member in its proper adjusted position on the base member and circuit board is preferably achieved by placing a pair of nuts on the control bushing/shaft(s) which nuts 'sandwich' the front of the cover. This, in turn, thereby locks the cover in fixed position according to the location of the nuts thereon. Alternatively, a pair of bolts may be threaded into the sidewalls of the base member through a corresponding pair of axial slots in the cover sidewalls. Once adjusted, these bolts can be tightened thereby locking the base and cover members in fixed axial relationship to one-another.

The adjusted chassis is preferably installed by inserting the device into holes placed in the aircraft panel(s), from the rear. More specifically, a panel drilling template is generally provided to permit the accurate placement of holes and other apertures in the panel through which the various controls of the electronic apparatus are placed, again from the rear. Final securement may be achieved either by use of the aforesaid nuts placed on the control bushing/shafts which may further service to 'sandwich' the aircraft panel thereby rigidly affixing the electronic device to the panel or by use of additional bolts extending through the aircraft panel and threaded into the front of the electronic device.

It is therefore an object of the present invention to provide an improved chassis for electronic apparatus for light aircraft which chassis can be mounted in and accommodate aircraft panel(s) of varying number and thickness. It is an object that such chassis, once mounted, shall provide sufficient, but not excessive, extension of the various switches and controls to assure proper capturing and use thereof and, further, a normal aesthetic appearance. It is a further object that such chassis shall be adjustable with a minimum of labor and should be inexpensive and simple of assembly. It is preferable, further, that the chassis be self-interlocking thereby minimizing the requirement for securement hardware and that the chassis should fully enclose the electronics therein and define the minimum of openings and edges through which electromagnetic radiation may enter or from which such energy may be radiated.

DESCRIPTION OF THE PREFERRED EMBODIMENT

Figure 1:
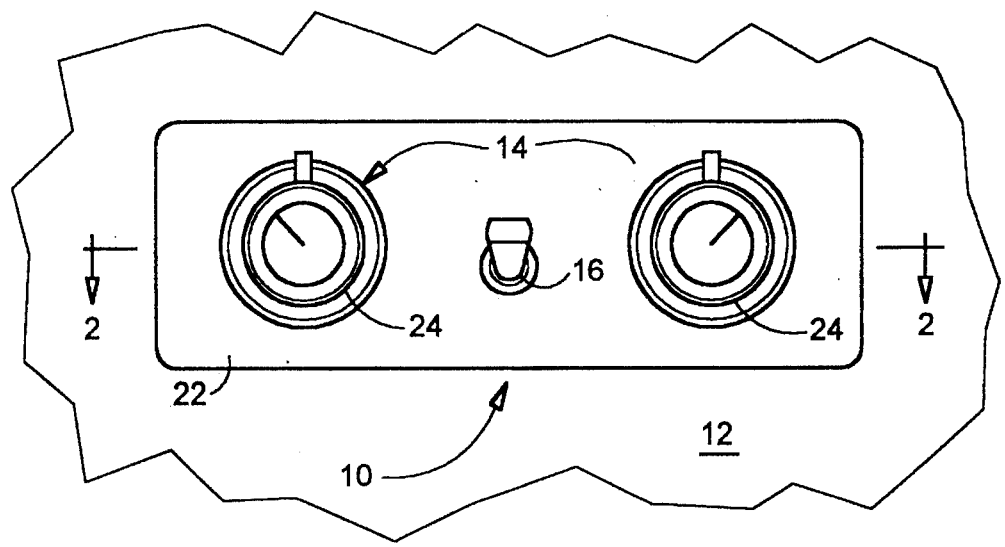
FIG. 1 is a front elevation view of an aircraft panel (fragmentary) in which an electronic device incorporating the adjustable chassis of the present invention is shown installed.

FIG. 1 illustrates an electronic device 10 incorporating the adjustable chassis of the present invention with device 10 shown mounted to an aircraft panel 12. Panel 12 may be of steel, aluminum or other alloy and, significantly, it may be of any reasonable thickness. Further, and as is common in many small single engine aircraft, panel 12 may include a plastic decorative panel positioned immediately adjacent and forwardly of the structure metal panel therebehind. The specific design and configuration of panel 12 is not part of this invention except to the extent that its variable overall thickness creates a mounting problem for electronic apparatus such as device 10, the solution to which problem the present invention is directed.

Figure 2A:
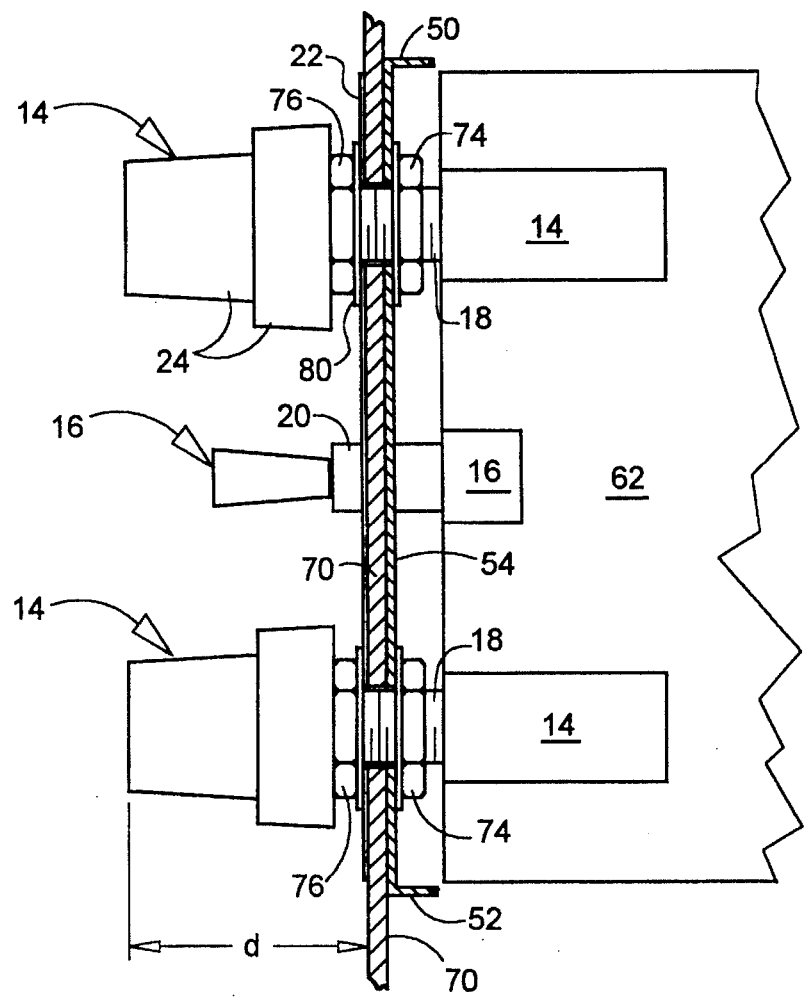
FIG. 2a is a top, righthand plan view, partially in section along line 2—2 of FIG. 1, and fragmentary, showing the chassis of the present invention installed in an aircraft panel of comparatively 'thin' gage.
Figure 2B:
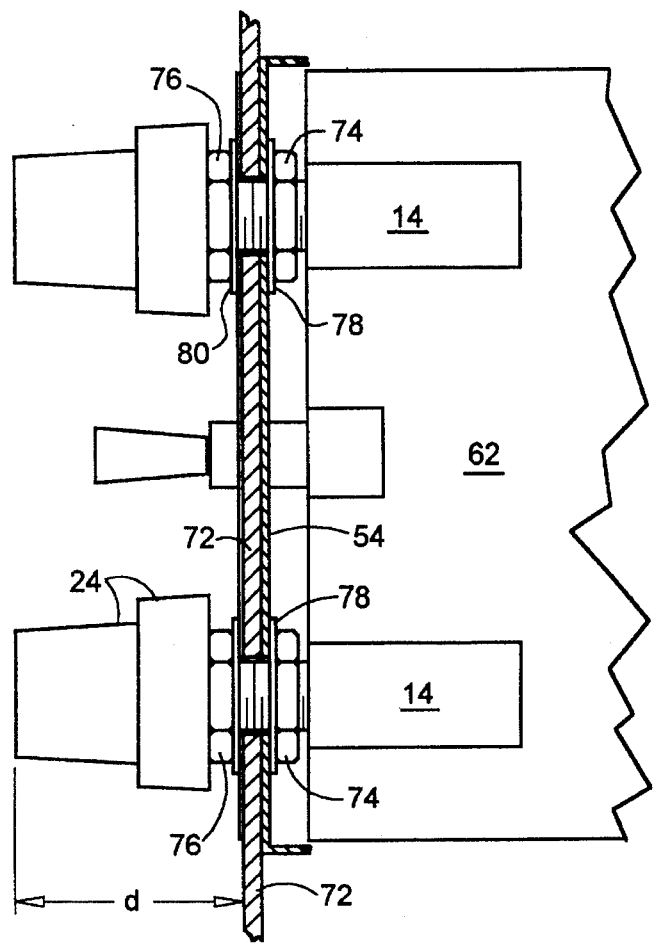
FIG. 2b is a top, righthand plan view, partially in section along line 2—2 of FIG. 1, and fragmentary, showing the chassis of the present invention installed in an aircraft panel of comparatively 'thick' gage.

Still referring to FIG. 1, the exemplary device 10 includes a pair of potentiometer controls 14 and a switch 16. It will be understood that other controls, switches, and/or indicators may be employed consistent with the teachings herein. Device 10 is mounted, as more fully described below, by drilling holes through the aircraft panel(s) 12 to receive control and switch bushings 18 and 20, respectively (FIGS. 2a and 2b). A metallic or mylar escutcheon plate 22, labelled to identify the electronic device and the functions of the various controls and switches included therein, may be placed against the aircraft panel and secured by adhesive or held in position by the bushing nuts or screws (described below) that serve to affix the electronic device to the panel. Knobs 24, as appropriate, are provided and placed on the controls following the mounting of device 10 to the aircraft panel(s) 12.

The adjustable chassis 26 of the present invention, best understood by reference to FIGS. 3 and 4, includes a lower or base member 30 and an upper cover member 32 which is telescopingly received on the base member as described hereinafter. Together, the base and cover members form a complete enclosure that surrounds the electronics thereby defining a shield against the ingress or egress of unwanted and potentially harmful electromagnetic radiation.

The base member 30 further defines the chassis bottom 34, left and right inner sidewalls 36 and 38, and rear wall 40 which rear and sidewalls, in turn, include left, right, and top flanges 42, 44, and 46, respectively extending forwardly from the rear wall 40. These flanges serve to receive corresponding mating surfaces of the cover member 32 for relative axial telescoping movement therebetween. The length $L_1$ (and $L_2$ discussed below) of these flanges determines the maximum range of chassis adjustment and therefore lengths $L_1$ and $L_2$ must be somewhat longer than the maximum chassis adjustment desired to assure proper engagement between these flanges and the mating chassis members throughout the full range of adjustment.

The cover member 32 similarly defines the chassis top 48, left and right outer sidewalls 50 and 52, and front wall 54. Flange 56 extends rearwardly from the cover front wall 48 a distance $L_2$ and serves to receive the mating base member bottom 34. Flange 56 must be of sufficient length $L_2$ to assure bottom 34 engagement over the full range of chassis adjustment. Lengths $L_1$ and $L_2$ are preferably not equal to thereby simply the sliding, telescoping engagement between the base and cover members. Specifically, it has been found desirable to sequence the engagement of the respective base and cover flanges to secure the proper engagement of one set of flanges prior to confronting engagement of the other set.

The electronic circuitry comprises a printed circuit board 60 which is positioned immediately adjacent and above bottom 34 of base member 30 and rigidly affixed thereto either by screws and appropriate bosses or stand-offs (not shown). In the case of relatively small and low mass printed circuit boards, such boards may be retained through the cooperation of rear connector 62 and forward controls 14 as discussed below. Specifically, connector 62 is rigidly mounted to the rear of the printed circuit board 60 (by soldering, fasteners, and/or screws) and, in turn, is rigidly affixed to the rear wall 40 of the base member through an aperture formed therein. Screws 64 may be employed for such attachment.

In this manner, the position of board 60 is fixed with respect to the base member 30 (fore/aft and laterally) with the rear portion of the board being further constrained against vertical motion. As controls 14 (and switch 16) are also mounted rigidly to the circuit board (again, through soldering and/or bolting thereto), the position of these controls relative to the rear wall 40 of the base member 30 is similarly fixed. In short, the distance of the front controls and switch from the connector and rear chassis wall does not change.

Figure 3:
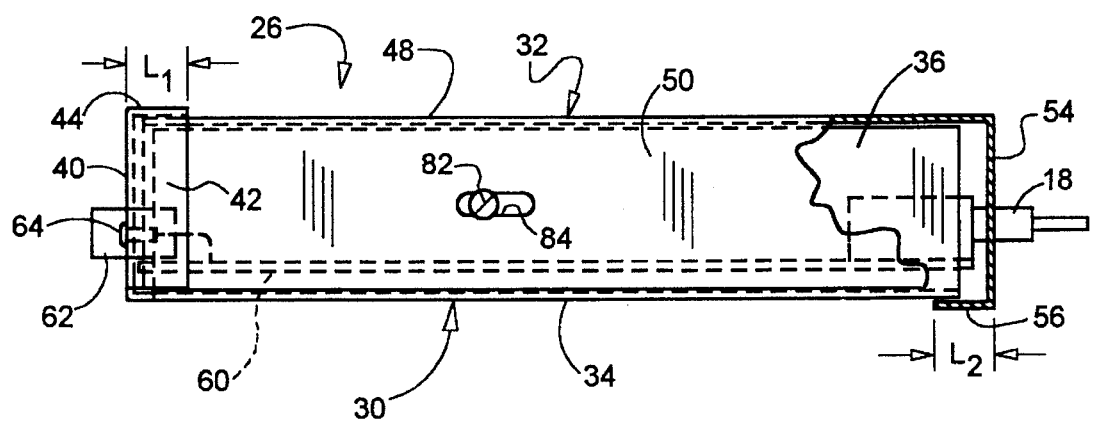
FIG. 3 side elevation view of an electronic device incorporating the adjustable chassis of the present invention; and, FIG. 4 is a lefthand top plan view of the electronic device and chassis of FIG. 3.
Figure 4:
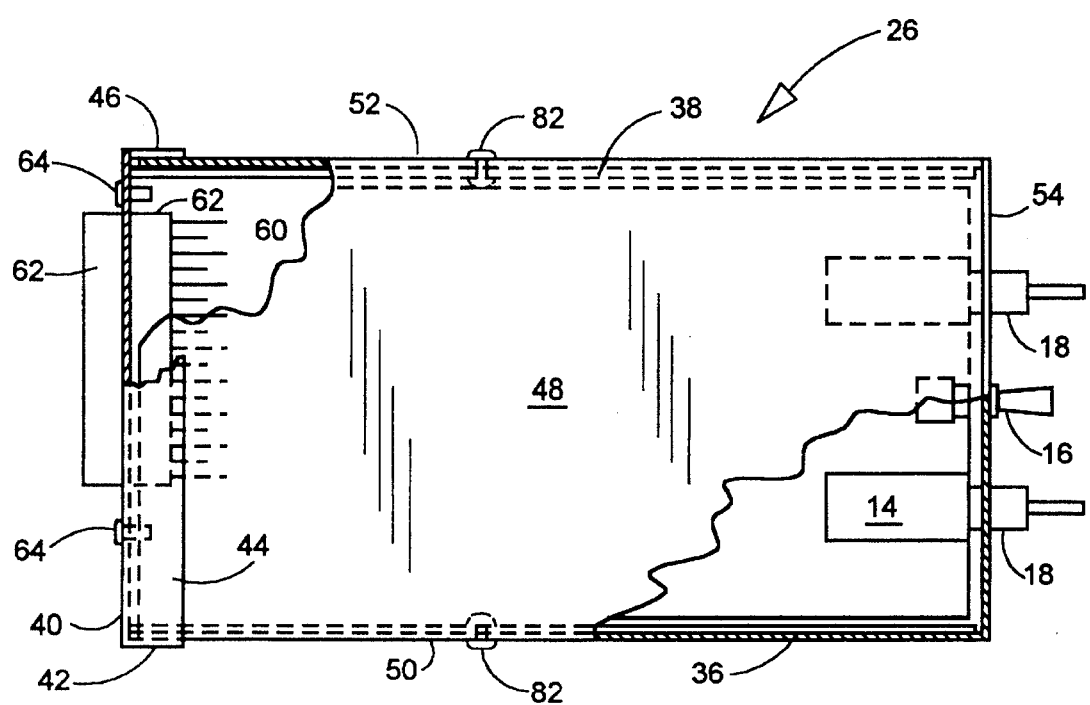

As best shown in FIG. 3, the height of the inner sidewalls 36 and 38 cooperates with the cover 32 to vertically position and restrain the cover in its proper and predetermined position in relation to base member 30. Specifically, sidewalls 36 and 38 are dimensioned substantially the full inside height of the chassis 26 thereby properly positioning the top 48 of the cover above the bottom 34 of the base.

Rear flanges 42, 44, and 46 and front flange 56 complete the vertical locking between the base and cover members. To this end the rear flange 44 is spaced above the upper edge of the inner sidewalls 36 and 38 an amount approximately equal to the thickness, or gage, of the sheet metal used to fabricate the cover member thereby permitting the top wall 48 to be slidingly received between the upper edges of the inner sidewalls 36 and 38 and the top flange 44. In similar manner the front flange 56 is spaced below the top wall 48 an amount substantially equal to the height of the inner sidewalls thereby positioning the front flange 56 immediately below the bottom 34. Thus engaged, the flanges 44 and 56 vertically lock the cover member 32 in position above base member 30.

Lateral engagement and locking of the cover and base members is controlled by proper dimensioning of the respective sidewalls. Specifically, the inside dimension of the outer sidewalls 50 and 52 and the outside dimension of the inner sidewalls 36 and 38 are substantially equal thereby precluding lateral movement of the cover when assembled on the base member. Rear side flanges 42 and 46 further lock the cover against lateral movement although these flanges are not required for proper locking restraint of the cover. It will be understood that the outer sidewalls 50 and 52 may be foreshortened to form flanges while maintaining lateral engagement and locking between the base and cover members and full enclosure of the electronics therein.

It will be appreciated that base and cover members (although locked against relative movement laterally and vertically) are free to move axially (i.e. along the fore/aft axis) with respect to one another, and will remain in locking engagement throughout such axial movement so long as the relative travel therebetween does not exceed, as noted above, flange lengths $L_1$ and $L_2$. Thus, by reason of this relative movement and, further, the rigid retention of the printed circuit board 60 on the base member 30, the front wall 54 may be adjusted and positioned in relationship to the controls 14 and switch 16 simply by sliding the cover member 32 axially fore or aft on the base member 30.

Holes or other apertures (not shown) are provided in the front wall 54 of the chassis to permit the controls and switches to extend therethrough, in turn, to similarly extend through the aircraft panel. These holes are preferably closely dimensioned with reference to the diameters of the associated controls and switches to thereby lock these controls, and the front of the printed circuit board, against lateral and vertical movement. In this manner, and in cooperation with the previously noted attachment of connector 62 to the rear wall of the chassis, the printed circuit board may be rigidly retained within the chassis of the present invention without specific further attachment of the board to the chassis.

The interrelationship of the chassis of the present invention with aircraft panels of varying thickness is best understood by reference to FIGS. 2a and 2b. FIG. 2a depicts the present chassis mounted on a relatively thin aircraft panel 70 while FIG. 2b represents a similar installation on a comparatively thicker aircraft panel 72. It should be understood that for proper installation, particularly for an acceptable aesthetic appearance, the control bushings 18 and shafts (onto which knobs 24 are mounted) must extend forwardly from the aircraft panel a fixed, predetermined distance, e.g. distance d, without regard to the thickness of the aircraft panel. In short, distance d remains constant and does not change from one panel thickness to another. As may now be apparent from the foregoing, to achieve this fixed, constant extension d, the variability in aircraft panel thickness (e.g. between panels 70 and 72) is accommodated by axially adjusting and positioning the front wall 54 of the cover member 32 with respect to the base member (and control bushings 18) so that the front wall 54 is in abutting contact to the aircraft panel.

In the preferred embodiment, a pair of cooperating nuts, inner nuts 74 and outer nuts 76, function both to lock the base and cover members in fixed relationship to one-another as well as to rigidly secure the entire chassis to the aircraft panel. More specifically, the inner nuts 74 are positioned and repositioned on control bushings 18—by trial and error if necessary—until the proper extension distance d is found. Washers 78 may be placed against the inner nuts with the cover member 32 thereafter being positioned over, and slid axially rearwardly, on the base member 30 until the front wall 54 of the cover is in abutting contact with the inner washers/nuts 74 and 78.

The assembled chassis is thereafter inserted, from the rear, through the aircraft panel(s) 70 or 72 whereupon the escutcheon plate 22, the outer washers 80 and nuts 76 may be installed. Firmly tightening outer nuts 76 serves to rigidly sandwich the front of the chassis and aircraft panel between the inner and outer nuts thereby, again, locking the base and cover members in fixed relative orientation and securing the chassis to the aircraft panel. If additional securement is required, bolts (not shown) may be inserted through the aircraft panel into engagement with appropriate nuts or threaded bosses on the chassis front wall. Alternatively, the base and cover members may be rigidly secured following proper axial adjustment by a screws 82 (FIG. 3) through the cover outer sidewalls 50 and 52 into threaded bosses or nuts (not shown) on the base inner sidewalls 36 and 38. Slots 84 are provided in the cover outer sidewalls to permit, as described, the relative axial movement of the cover on the base.

It is thought that the invention and many of its attendant advantages will be understood from the foregoing description, and it is apparent that various changes may be made in the form, construction and arrangement of its component parts without departing from the spirit and scope of the invention or sacrificing all of its material advantages, the forms described being merely preferred embodiments thereof.

In view of the above, we wish to be limited not by the specific embodiment illustrated but only by the scope of the appended claims wherein it is claimed:

What is claimed:

1. An adjustable chassis enclosing electronic circuitry for mounting in an aircraft panel or other panel of uncertain and variable thickness, the electronic circuitry having control means rigidly affixed thereto and extending therefrom for insertion through a panel, the control means defining a longitudinal axis; the adjustable chassis having a base member and cover member, said members defining and completely enclosing an adjustable interior region which contains said electronic circuitry; the cover member defining a planar front wall and having at least one aperture therein adjustably repairing said control means therethrough; means rigidly affixing electronic circuitry to the base member within said adjustable interior region, the control means extending outwardly from within the interior region through the aperture, the longitudinal axis of the control means oriented perpendicularly to the planar front wall; means interconnecting the base and cover members for relative movement along the longitudinal axis between first contracted and second extended positions whereby when the base and cover members are contracted, the control means extends further outwardly of the cover front wall thereby permitting installation into panels of greater thickness and whereby when the base and cover members are extended, the control means does is not extended as far outwardly of the front wall thereby permitting installation in panels of lesser thickness.

* * * * *